United States Patent [19]

Nagahama

[11] 4,191,932
[45] Mar. 4, 1980

[54] VOLTAGE-CONTROLLED OSCILLATOR

[75] Inventor: Yasuo Nagahama, Hamamatsu, Japan

[73] Assignee: Nippon Gakki Seizo Kabushiki Kaisha, Hamamatsu, Japan

[21] Appl. No.: 907,642

[22] Filed: May 19, 1978

Related U.S. Application Data

[63] Continuation of Ser. No. 758,293, Jan. 10, 1977, abandoned.

[30] Foreign Application Priority Data

Jan. 16, 1976 [JP] Japan .................................. 51-4116
Sep. 16, 1976 [JP] Japan ................................ 51-111160
Sep. 17, 1976 [JP] Japan ................................ 51-111596

[51] Int. Cl.² .................... G10H 1/04; G10H 5/12; H03K 4/50
[52] U.S. Cl. .................................... 331/111; 84/1.25; 307/228; 328/183; 331/178

[58] Field of Search ............... 331/111, 143, 178; 84/1.25; 307/228; 328/183

[56] References Cited

U.S. PATENT DOCUMENTS

| 3,263,093 | 7/1966 | Erdmann | 331/111 |
| 3,339,155 | 8/1967 | Camenzind | 331/111 |
| 3,376,518 | 4/1968 | Emmer | 331/111 |
| 3,440,325 | 4/1969 | Schwartz et al. | 84/1.25 |
| 3,986,426 | 10/1976 | Faulhaber | 84/1.25 |

*Primary Examiner*—Siegfried H. Grimm
*Attorney, Agent, or Firm*—Herbert L. Boettcher

[57] ABSTRACT

A voltage-controlled type oscillator utilizing charging and discharging of a capacitor. The oscillation frequency is made to vary in exact proportion to the control voltage by variably controlling electric charge in accordance with the control voltage during charging and discharging of the capacitor.

5 Claims, 5 Drawing Figures

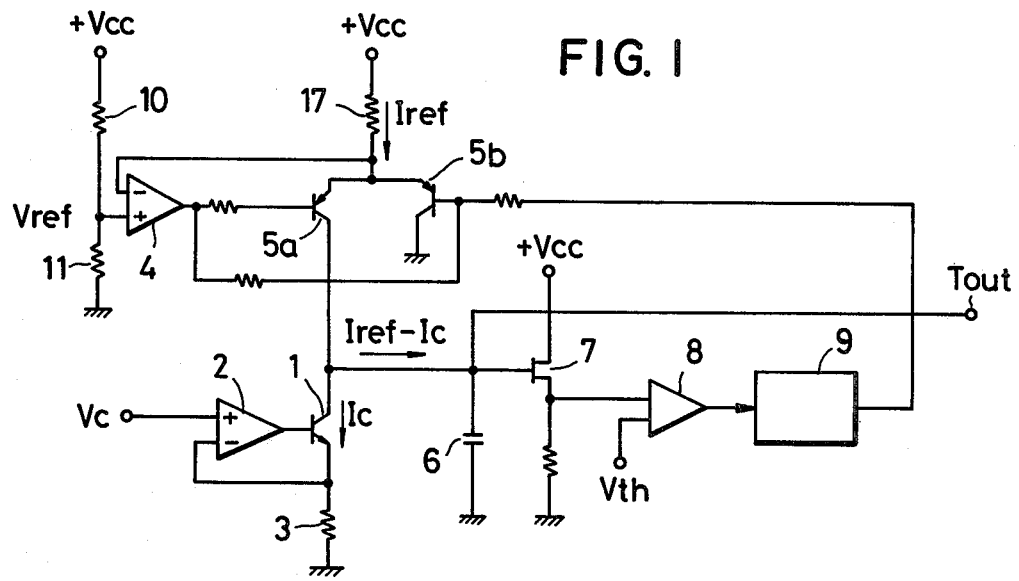

VOLTAGE-CONTROLLED OSCILLATOR

This is a continuation of application Ser. No. 758,293 filed Jan. 10, 1977 and now abandoned.

BACKGROUND OF THE INVENTION

This invention relates to improvements on a voltage-controlled oscillator.

In a prior art voltage-controlled oscillator, a capacitor is charged by a constant current Ic which is controlled by a control voltage Vc. Reaching of the charged voltage to a predetermined voltage $V_{th}$ is detected by a comparator and thereupon a monostable multivibrator is actuated to bring a transistor parallelly connected to the capacitor into conduction and thereby to discharge the capacitor. According to this prior art voltage-controlled oscillator, electric charge up to which the capacitor is charged is constant regardless of the control voltage Vc, and therefore the control voltage Vc controls the charging time T only. If capacity of the capacitor is represented by C and reference voltage by $V_{ref}$, the electric charge to be charged in the capacitor is $C(V_{ref}-V_{th})$, and the charging time is $$T \approx \frac{C(V_{ref} - V_{th})}{\frac{Vc}{R}}$$

(where R represents resistance and $V_c/R = 1c$). On the other hand, discharging time $\tau$ is determined by the pulse width of the monostable multivibrator. Thus, the oscillation frequency f is represented by an equation $f = 1/(T+\tau)$. The discharging time $\tau$ is constant regardless of the oscillation frequency f and, accordingly, the discharging time $\tau$ cannot be disregarded if the oscillation frequency f is high, though $\tau$ can be neglected if the oscillation frequency f is low. Consequently, there arises an inconvenience that the oscillation frequency f is not exactly proportional to the control voltage.

SUMMARY OF THE INVENTION

It is, therefore, an object of the present invention to provide a novel voltage-controlled oscillator in which a produced oscillation frequency is exactly proportional to the control voltage.

It is another object of the invention to provide a voltage-controlled oscillator suitable for use as a vibrato generating unit of an electronic musical instrument which is capable of imparting an excellent vibrato effect to a musical tone produced notwithstanding its simple construction. According to the invention, the vibrato effect can be produced by vibrating a reference voltage $V_{ref}$ by means of a low frequency oscillator thereby to vibrate a reference constant current $I_{ref}$.

It is still another object of the invention to provide a voltage-controlled oscillator suitable for use as a vibrato generating unit of an electronic musical instrument which is capable of producing an excellent vibrato effect by vibrating, by means of a low frequency oscillator, pulse width $\tau$ of the pulse produced by the monostable multivibrator.

BRIEF DESCRIPTION OF THE DRAWINGS

In the accompanying drawings, FIG. 1 is a circuit diagram showing one preferred embodiment of the voltage-controlled oscillator according to the invention;

FIGS. 2(a) and 2(b) are graphical diagrams showing waveforms produced at some points of the circuit shown in FIG. 1;

FIG. 3 is a circuit diagram showing an example of a vibrato generating unit of an electronic musical instrument employing the voltage controlled oscillator shown in FIG. 1;

DETAILED DESCRIPTION OF THE INVENTION

Figure 4:
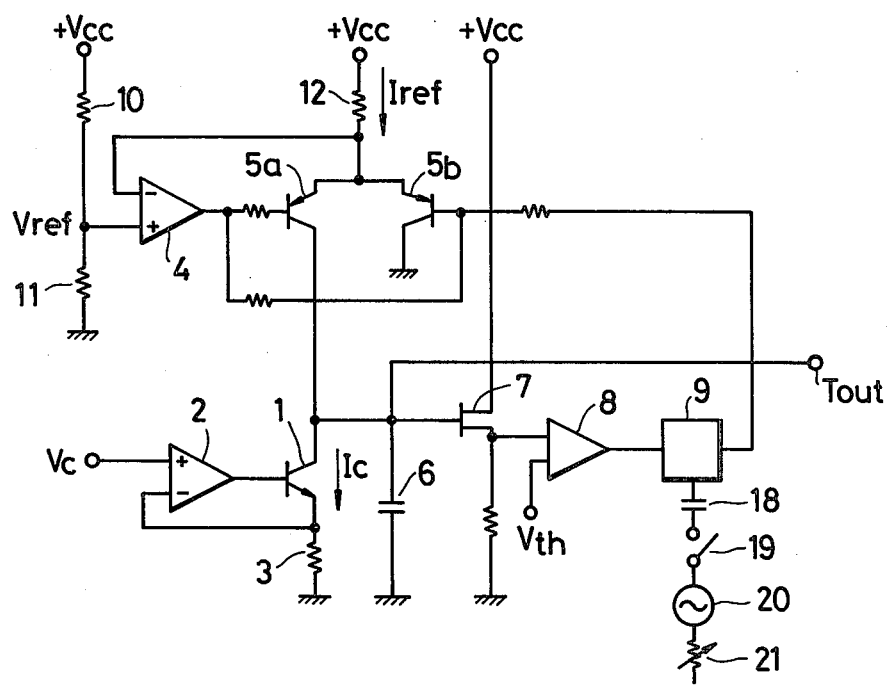
FIG. 4 is a circuit diagram showing another example of the vibrato generating unit of an electronic musical instrument.

Referring first to FIG. 1, a control voltage Vc is applied through an operational amplifier 2 to a transistor 1 which constitutes a constant current source. If resistance value of a resistor 3 connected to the emitter side of the transistor 1 is represented by R, a constant current $Ic = Vc/R$ which is proportional to the control voltage Vc flows through the collector of the transistor 1. An operational amplifier 4 and a transistor 5a constitute a constant current source for providing a reference constant current $I_{ref}$ which is proportional to the reference voltage $V_{ref}$. When the capacitor 6 is discharged, i.e., a transistor 5b is ON as will be described later, the transistor 5a is OFF. Accordingly, the capacitor 6 discharges in accordance only with the constant current $I_c = V_c/R$ which is proportional to the control voltage $V_c$(FIG. 2(a)).

The voltage of the capacitor 6 is applied to a comparator 8 through a buffer FET 7. When the voltage drops to a lower limit reference voltage $V_{th}$, the comparator 8 produces an output "1" which drives a monostable multivibrator 9 to produce a pulse of time width $\tau$ (FIG. 2(b)). The output pulse of the multivibrator 9 is applied to the transistor 5b to bring it out of conduction. This brings the transistor 5a into conduction allowing the reference constant current $I_{ref}$ to flow through the transistor 5a. Since the constant current $I_c$ flows through the transistor 1, a difference current $I_{ref}-I_c$ between the reference constant current $I_{ref}$ and the constant current $I_c$ determined by the control voltage $V_c$ flows into the capacitor 6 to charge it. When the pulse from the monostable multivibrator 9 has become "0", i.e., time $\tau$ has elapsed, the transistor 5b becomes ON whereas the transistor 5a becomes OFF. Consequently, the capacitor 6 is discharged by the constant current Ic as was previously described.

If the peak voltage of a saw-tooth waveform appearing across the capacitor 6 is represented by $V_{pp}$ and capacity of the capacitor 6 by C, electric charge during the charging period is given by an equation $$CV_{pp} = \tau(I_{ref} - (Vc/R)) \quad (1)$$

whereas electric charge during the discharging period is given by an equation $$CV_{pp} = T(Vc/R) \quad (2)$$

Since the equation (1) is equal to the equation (2), $$(T+\tau)(Vc/R) = \tau I_{ref} \quad (3)$$

The oscillation frequency f therefore is given by an equation $$f = 1/(T+\tau) = V_c/(\tau \cdot I_{ref} R) \tag{4}$$

In the above equations, T represents discharging time and τ charging time. From the equation (4), it will be understood that the oscillation frequency f is proportional to the control voltage Vc, for τ, $I_{ref}$ and R are all constants. That is, $f \propto V_c$.

It will be apparent from the foregoing description that the electric charge $CV_{pp}$ of the capacitor 6 is determined by the equation (1) so that the electric charge $CV_{pp}$ varies with the control $V_c$. Accordingly, notwithstanding the fact that the charging time τ is constant irrespective of variation of the control voltage Vc(i.e., the oscillation frequency f) the discharging time T varies in accordance with variation in the electric charge $CV_{pp}$ as will be apparent from the equation (2) and, accordingly, the oscillation frequency varies in proportion to the control voltage Vc(the equation (4)).

FIG. 3 shows an embodiment of the voltage-controlled oscillator constituting a vibrato generating unit of an electronic musical instrument. Throughout FIG. 1 and FIG. 4, the same component parts are designated by the same reference numerals.

Resistors 10 and 11 are provided for supplying the reference voltage $V_{ref}$ to a non-inverted input terminal of the operational amplifier 4. A low frequency oscillator 15 is connected though a vibrato switch 14 and a capacitor 13 to a connection point 12 of the resistors 10 and 11. The low frequency oscillator 15 is adapted to produce a vibrato signal. The speed and depth of the vibrato is controlled by varying the oscillation frequency and amplitude of the oscillator 15 by means of a variable resistor 16.

A note voltage which is proportional to the frequency of each note is used as the control voltage Vc to be applied to the non-inverted input terminal of the operational amplifier 2. Accordingly, the current $I_c = (V_c/R)$ flowing through the collector of the transistor 1 becomes a value proportional to the note voltage.

When the vibrato switch 14 is OFF, the reference constant current $I_{ref}$ is a value defined by the reference voltage $V_{ref}$. If the value of a resistor 17 on the emitter side of a pair of transistors 5a, 5b is represented by $R_2$, $$I_{ref} = (V_{cc} - V_{ref})/R_2 \tag{5}$$

Thus, a saw-tooth waveform of frequency f represented by the equation (4) which frequency is proportional to the control voltage $V_c$ (note voltage) is delivered out of an output terminal $T_{out}$.

When the vibrato switch is ON, a variation voltage ΔV is added to and subtracted from (preferably in a sinusoidal manner) the reference voltage to be applied to the non-inverted input terminal of the operational amplifier 4 whereby the voltage applied to the operational amplifier 4 becomes $V_{ref} \pm \Delta V$. Accordingly, a reference current $I'_{ref}$ flowing through the resistor 17 is $$I'_{ref} = \frac{V_{cc} - (V_{ref} \pm \Delta V)}{R_2} = I_{ref} \pm \frac{\Delta V}{R_2} \tag{6}$$

Consequently, oscillation frequency f' appearing at the output terminal $T_{out}$ is $$f' = \frac{V_c}{\tau \cdot I'_{ref} \cdot R} = \frac{V_c}{\tau \cdot (I_{ref} \pm \frac{\Delta V}{R_2}) \cdot R} \tag{7}$$

Thus, a saw-tooth waveform which has been frequency-modulated and imparted with vibrato in accordance with the output of the low frequency oscillator 15 and which has a center frequency corresponding to the control voltage $V_c$ (note voltage) is obtained. The vibrato effect obtained in the above described manner is found to be superior to the vibrato effect obtained by varying the control voltage $V_c(I_c)$.

FIG. 4 shows another example of the vibrato generating unit in which the same component parts as in FIG. 3 are designated by the same reference numerals.

A low frequency oscillator 20 is connected to a monostable multivibrator 9 through a capacitor 18 and a vibrato switch 19. The low frequency oscillator 20 is provided for producing a vibrato signal. The speed and depth of vibrato are controlled by varying the oscillation frequency and amplitude of the oscillator 20 by means of a variable resistor 21.

Figure 5:
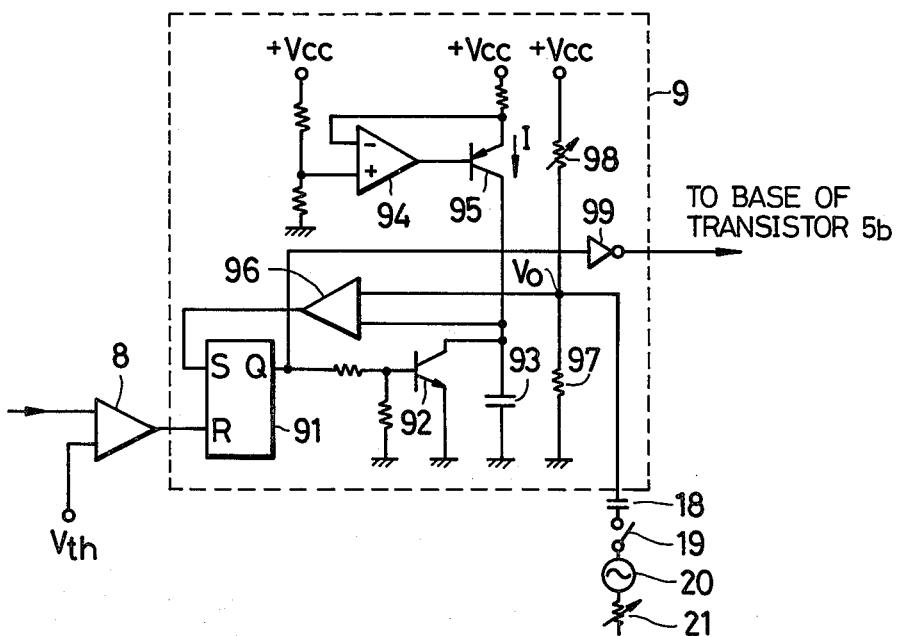
FIG. 5 is a circuit diagram showing the circuit of the monostable multivibrator shown in FIG. 4 in detail.

The monostable multivibrator 9 consists of a circuit as shown in FIG. 5. When the vibrato switch is thrown in, the vibrato signal from the low frequency oscillator 20 is applied to the monostable multivibrator 9 whereby the pulse time width τ varies in accordance with this vibrato signal.

When the voltage of the capacitor 6 drops below the lower limit reference voltage $V_{th}$, a comparator 8 produces a signal "1" which is applied to a reset terminal R of a flip-flop 91 in the monostable multivibrator 9 to reset the flip-flop 91. Consequently, the output Q of the flip-flop 91 becomes "0" and this brings a transistor 92 out of conduction and thereby initiates charging of a capacitor 93. Charging of the capacitor 93 is effected by the constant current I flowing from a constant current source consisting of an operational amplifier 94 and a transistor 95. The voltage across the capacitor 93 is supplied to a comparator 96 and compared therein with a reference voltage Vo determined by a resistor 97 and a variable resistor 98. When the voltage across the capacitor 93 has reached the reference voltage Vo, the comparator 96 produces a signal "1" which is supplied to the flip-flop 91 to reset it. This brings the transistor 92 into conduction and thereby causes the capacitor 93 to discharge.

Accordingly, the pulse time width τ delivered through an inverter 99 is determined by the constant current I and capacity Co of the capacitor C as expressed by the following equation (8):

$$\tau = (Vo \cdot Co)/I \tag{8}$$

Since the monostable multivibrator 9 is constructed in such a manner that the vibrato signal ΔV from the low frequency oscillator 20 is added to and subtracted from (preferably in a sinusoidal manner) the reference voltage Vo by throwing in of the vibrato switch 19, a pulse time width τ' during which the vibrato is imparted is $$\tau' = \frac{Vo(1 \pm \frac{\Delta V}{Vo}) \cdot Co}{I} = \tau(1 \pm \frac{\Delta V}{Vo}) \tag{9}$$

It will be understood from the foregoing description that the oscillation pulse time width $\tau'$ of the monostable multivibrator 9 can be varied in accordance with the vibrato signal from the low frequency oscillator 20 upon throwing in of the vibrato switch.

In FIG. 4, a note voltage proportional to the frequency of each note, for example, is employed as the control voltage Vc applied to the non-inverted input terminal of the operation amplifier 2.

If the vibrato switch 19 is OFF, the capacitor 6 is charged during the time $\tau$ by the difference current $I_{ref} - I_c$ and discharged by the constant current Ic which is determined by the control voltage (note voltage) Vc in the previously described manner with a result that a saw-tooth waveform of frequency f as expressed by the equation (4) is provided from the output terminal $T_{out}$.

When the vibrato switch 19 is turned ON, the pulse width of the pulse generated by the monostable multivibrator 9 becomes $\tau'$ represented by the equation (9) and determined by the output of the low frequency oscillator 20. The oscillation frequency f' of the signal appearing at the output terminal $T_{out}$ is $$f = \frac{V_c}{\tau' \cdot I_{ref} \cdot R} = \frac{V_c}{\tau(1 \pm \frac{\Delta V}{V_0}) \cdot I_{ref} \cdot R} \quad (10)$$

Thus, a frequency signal which has been frequency-modulated and imparted with vibrato in accordance with the output of the low frequency oscillator 20 and which has a frequency corresponding to the control voltage (not voltage) Vc is obtained. The vibrato produced in the above described manner also has an excellent acoustic effect.

In the foregoing examples of the voltage-controlled oscillator, the capacitor is discharged by the constant current Ic determined by the control voltage Vc and charged by the difference current between the constant current Ic and the reference constant current $I_{ref}$. It will, however, be apparent to the skilled in the art that a construction may be designed in which the capacitor is charged by the constant current Ic and discharged by the difference current.

What is claimed is:

1. A voltage-controlled oscillator for producing a saw-tooth output having an oscillator frequency proportional to an input control voltage, said oscillator comprising:
   (a) a capacitor, across which said output is produced;
   (b) first means for charging said capacitor with a first constant current;
   (c) second means for discharging said capacitor with a second constant current, one of said first and second constant currents being proportional to said input control voltage, the other constant current being a difference current produced by subtracting said one constant current from a separate reference constant current independent of said input control voltage; and
   (d) third means, including a timing circuit, alternately rendering said one constant current and said other constant current effective upon said capacitor for respective first and second time periods, said second time period starting when the voltage across said capacitor has reached a predetermined value and ending upon the lapse of a predetermined time length controlled by said timing circuit, said first time period starting at the ending of said second time period and ending at the starting of said second time period.

2. A voltage-controlled oscillator according to claim 1, wherein said second constant current is determined by said input control voltage, whereby said first constant current is said difference current and is produced by subtracting said second constant current from said separate reference constant current.

3. A voltage-controlled oscillator as defined in claim 1, adapted for use for a vibrato generating device in an electronic musical instrument, further comprising fourth means for varying said reference constant current in accordance with the output of a low frequency oscillator.

4. A voltage-controlled oscillator as defined in claim 1, wherein said timing circuit comprises:
   a comparator for detecting when the voltage across said capacitor has reached said predetermined value; and
   a monostable multivibrator connected to said comparator and producing a pulse which starts upon said detecting of said predetermined voltage value across said capacitor and finishes upon the lapse of a time defining said predetermined time length.

5. A voltage-controlled oscillator as defined in claim 1, further comprising a circuit which varies the pulse width of the pulse produced by said monostable multivibrator in accordance with the output of a low frequency oscillator.

* * * * *